(12) United States Patent
Houbertz et al.

(10) Patent No.: US 10,882,072 B2
(45) Date of Patent: Jan. 5, 2021

(54) STRUCTURED LAYERS COMPOSED OF CROSSLINKED OR CROSSLINKABLE METAL-ORGANIC COMPOUNDS, SHAPED BODIES CONTAINING THEM AS WELL AS PROCESSES FOR PRODUCING THEM

(75) Inventors: Ruth Houbertz, Wurzburg (DE);
Daniela Trotschel, Werneck (DE)

(73) Assignee: Multiphoton Optics GmbH, Würzburg (DE)

( * ) Notice: Subject to any disclaimer, the term of this patent is extended or adjusted under 35 U.S.C. 154(b) by 707 days.

(21) Appl. No.: 13/699,201

(22) PCT Filed: May 24, 2011

(86) PCT No.: PCT/EP2011/058512
§ 371 (c)(1),
(2), (4) Date: Feb. 28, 2013

(87) PCT Pub. No.: WO2011/147854
PCT Pub. Date: Dec. 1, 2011

(65) Prior Publication Data
US 2013/0168597 A1  Jul. 4, 2013

(30) Foreign Application Priority Data
May 25, 2010  (DE) .................. 10 2010 021 466

(51) Int. Cl.
*B05D 3/06* (2006.01)
*H01L 41/187* (2006.01)
(Continued)

(52) U.S. Cl.
CPC .............. *B05D 3/06* (2013.01); *C04B 35/468* (2013.01); *C04B 35/491* (2013.01);
(Continued)

(58) Field of Classification Search
CPC ....... H01L 41/18; H01L 41/1871; B05D 3/06; B05D 3/061; B05D 3/067; C04B 35/468; C09D 4/00
See application file for complete search history.

(56) References Cited

U.S. PATENT DOCUMENTS 3,699,482 A * 10/1972 Ash .................... H03H 9/02543
257/414
5,578,539 A 11/1996 Glaubitt et al.
(Continued)

FOREIGN PATENT DOCUMENTS

| DE | 38 35 794 A1 | 4/1990 |
|---|---|---|
| DE | 41 22 743 C1 | 11/1992 |

(Continued)

OTHER PUBLICATIONS

International Preliminary Report on Patentability from PCT/EP2011/058512—7 pages (2013).
(Continued)

*Primary Examiner* — Robert S Walters, Jr.
(74) *Attorney, Agent, or Firm* — Dority & Manning, P.A.

(57) ABSTRACT

The invention relates to a process for producing a structured shaped body or a layer of this type from a precursor of a metal oxide or mixed oxide selected from compounds of metals selected from among magnesium, strontium, barium, aluminum, gallium, indium, silicon, tin, lead and the transition metals. The process includes at least the following steps: (a) dissolving at least one compound of the at least one metal in an organic solvent and/or exchanging a ligand of the one or more dissolved metallic compounds for a stabilizing ligand, (b) adding a ligand that has at least one photochemically polymerizable group and at least one such group that allows a stable complex formation to the solution and forming a sol with or from the product of this reaction (precursor), (c) applying the sol on a substrate, and (d)
(Continued)

exposing the sol anisotropically in such a way that a polymerization of the photochemically polymerizable groups takes place in the exposed areas.

7 Claims, 2 Drawing Sheets

(51) Int. Cl.
    C04B 35/626 (2006.01)
    C08F 20/06 (2006.01)
    C09D 4/00 (2006.01)
    C04B 35/491 (2006.01)
    C04B 35/468 (2006.01)
    H01L 41/318 (2013.01)
    C23C 18/06 (2006.01)
    H01L 41/331 (2013.01)
    C23C 18/12 (2006.01)
    C23C 18/14 (2006.01)
    H01L 41/18 (2006.01)

(52) U.S. Cl.
    CPC ...... C04B 35/6263 (2013.01); C04B 35/6264 (2013.01); C04B 35/62675 (2013.01); C04B 35/62685 (2013.01); C08F 20/06 (2013.01); C09D 4/00 (2013.01); C23C 18/06 (2013.01); C23C 18/1216 (2013.01); C23C 18/1254 (2013.01); C23C 18/143 (2019.05); H01L 41/18 (2013.01); H01L 41/1871 (2013.01); H01L 41/1876 (2013.01); H01L 41/318 (2013.01); H01L 41/331 (2013.01); C04B 2235/441 (2013.01); C04B 2235/606 (2013.01); C04B 2235/661 (2013.01); C04B 2235/665 (2013.01)

(56) References Cited

U.S. PATENT DOCUMENTS

| | | | |
|---|---|---|---|
| 5,580,614 A | 12/1996 | Amberg-Schwab et al. | |
| 5,656,073 A | 8/1997 | Glaubitt et al. | |
| 5,958,815 A | 9/1999 | Loebmann et al. | |
| 6,054,253 A * | 4/2000 | Fardad | G02B 1/045 385/131 |
| 6,184,610 B1 * | 2/2001 | Shibata | H01J 1/316 313/309 |
| 6,291,070 B1 | 9/2001 | Arpac et al. | |
| 6,403,161 B1 | 6/2002 | Loebmann et al. | |
| 6,860,933 B2 | 3/2005 | Loebmann et al. | |
| 2002/0142096 A1 * | 10/2002 | Connell | G02B 1/045 427/271 |
| 2003/0076007 A1 * | 4/2003 | Murai | B41J 2/14233 310/324 |
| 2006/0222762 A1 * | 10/2006 | McEvoy | G02B 6/0065 427/162 |
| 2008/0081264 A1 * | 4/2008 | Mennig et al. | 430/2 |

FOREIGN PATENT DOCUMENTS

| | | |
|---|---|---|
| DE | 43 32 831 C1 | 10/1994 |
| DE | 196 22 500 A1 | 12/1997 |
| DE | 196 35 722 A1 | 3/1998 |
| DE | 199 21 261 A1 | 12/2000 |
| DE | 199 43 789 A1 | 3/2001 |
| DE | 10 2004 061324 | 6/2006 |
| EP | 1 050 520 B1 | 11/2000 |

OTHER PUBLICATIONS

Bathurst et al., "Direct Printing of Lead Zirconate Titanate Thin Films for Microelectromechanical Systems", IEEE 21$^{st}$ International Conference on Micro Electro Mechanical Systems, Jan. 13-17, 2008, Tucson, Arizona, pp. 391-394.

De Keijser et al., "Structural and Electrical Characterization of Heteroepitaxial Lead Zirconate Titanate Thin Films", Journal of Applied Physics, vol. 79, No. 1, Jan. 1996, pp. 393-402.

Harnagea et al., "Mesoscopic Ferroelectric Cell Arrays Prepared by Imprint Lithography", Applied Physics Letters, vol. 83, No. 9, Sep. 2003, pp. 1827-1829.

Houbertz, "Laser Interaction in Sol-Gel Based Materials—3-D Lithography for Photonic Applications", Applied Surface Science, vol. 247, Issue 1-4, 2005, pp. 504-512.

Janas et al., "Overview of Fine-Scale Piezoelectric Ceramic/Polymer Composite Processing", Journal of the American Ceramic Society, vol. 78, No. 11, Nov. 1995, pp. 2945-2955.

Liu et al., "Interdigital Pair Bonding for High Frequency (20-50 MHz) Ultrasonic Composite Transducers", IEEE Transactions on Ultrasonics, Ferroelectrics, and Frequency Control, vol. 48, No. 1, Jan. 2001, pp. 299-306.

Ren et al., "Piezoelectric and Ferroelectric Films for Microelectronic Applications", Materials Science and Engineering: B, vol. 99, Issued 1-3, May 2003, pp. 159-163.

Schwartz et al., "Chemical Solution Deposition of Perovskite Thin Films", Chemistry of Materials, vol. 9, No. 11, Nov. 1997, pp. 2325-2340.

Shinmou et al., "Fine-Patterning of $ZrO_2$ Thin Films by the Photolysis of Chemically Modified Gel Films", Japanese Journal of Applied Physics, vol. 33, Issue 8B, Aug. 1994, pp. L1181-L1184.

Soyama et al., "Preparation of Dielectric Thin Films from Photosensitive Sol-Gel Solution", Japanese Journal of Applied Physics, vol. 33, Issue 9B, 1994, pp. 5268-5271.

Tohge et al., "Direct Fine-Patterning of PZT Thin Films Using Photosensitive Gel Films Derived from Chemically Modified Metal-Alkoxides", Journal of Materials Science: Materials in Electronics, vol. 10, Issue 4, Jun. 1999, pp. 273-277.

Watanabe et al., "Direct Patterning of Crystallized $BaTiO_3$ and $TiO_2$ Films in Aqueous Solutions", Thin Solid Films, vol. 515, Issue 4, Dec. 2006, pp. 2696-2699.

Weihua et al., "Photosensitive Barium Strontium Titanate Gel Films and Their Fine-Patterning", Chinese Journal of Semiconductors, vol. 27, Issue 9, 2006, pp. 1590-1594.

Zhao et al, "Fabrication of High Quality PZT Thick Film Using Lift-Off-Technique", Nanotech, vol. 1, 2003, pp. 502-505.

International Search Report from PCT/EP2011/058512—4 pages (2012).

Mei Zhang et al., "GC-MS and 13 C NMR Investigation of Lead Zirconage Titanate Precursor Sols for Fiber Preparation", Journal of the American Ceramic Society, vol. 90, No. 2, Feb. 2007, pp. 358-363.

* cited by examiner

STRUCTURED LAYERS COMPOSED OF CROSSLINKED OR CROSSLINKABLE METAL-ORGANIC COMPOUNDS, SHAPED BODIES CONTAINING THEM AS WELL AS PROCESSES FOR PRODUCING THEM

FIELD OF THE INVENTION

This invention deals with the manufacturing of structured shaped bodies and thinner or thicker layers from organometallic compounds made of organometallic compounds that can be organically cross-linked using a photochemical path from which—through sintering and, if applicable, subsequent physical activation such as polarization using an electrical field or activation using a magnetic field if magnetic materials are contained therein—technically relevant oxidic functional bodies or layers can be manufactured, for example, in form of magnetically or piezoelectrically active sensors or actuators or (energy) transducers such as ultrasound transducers from PZT (lead zirconate titanate) or BTO (barium titanate). The invention presents a process for manufacturing such bodies or layers and a process based on it for manufacturing the functional, oxidic bodies or layers.

BACKGROUND OF THE INVENTION

Piezoelectrically active materials are employed, for example, as actuators or sensors in several fields such as ultrasound technology. Due to the general trend towards smaller, cheaper and nonetheless more efficient electronic components, interest has grown in ultrasound arrays made of piezoactive materials that have particularly small, lateral extensions in medicine, for example (see I. R. S. Makin et al., Med. Biol. (2005) 31, 1539-1550) or in non-destructive materials testing (S. D. Song et al., Nucl. Eng. Des. (2002) 214, 151-161). Ultrasound arrays are defined as group emitters that consist of many small individual ones (B. Waldron, G. Kauth, Ultraschall-Array-Technik für industrielle Anwendungen [Ultrasound Array Method for Industrial Applications], ZfP-Zeitung (2000) 69, 50-52). These group emitters can be produced by suitably processing a large emitter. These arrays make it possible to obtain more precise and high-resolution diagnoses with higher operating frequencies in various medical fields such as ophthalmology, dermatology and vascular wall diagnostics. Owing to its high piezoelectric coefficients, PZT can be used very well in these fields as material for the high performance arrays. BTO also has sufficiently high piezoelectric coefficients for these applications.

The display possibilities of PZT and BTO thin layers very roughly extend to chemical and physical vapor phase depositions (CVD and PVD) all the way to wet chemical processes (sol-gel chemistry) (M. de Keijser et al., J. Appl. Phys. (1996) 79, 393-402; T.-L. Ren et al., Mater. Sci. Eng. B (2003) 99, 159-163; R. W. Schwartz et al., Chem. Mater. (1997) 9, 2325-2340; C. J. Brinker, G. W. Scherrer, Sol-Gel Science, Boston, Mass., Academic Press (1990)). Some of the advantages of wet chemical processes compared with the vapor phase depositions are more economical reaction set-ups and easier reaction control. Furthermore, since sol-gel chemistry does not depend on substrates, shaped bodies and fibers, among other things, can also be made there from. DE 43 32 831 C1 describes processes for manufacturing PZT sols and the associated, PZT-based shaped bodies. In the described process, carboxylic acids are added to commercially available titanium and zirconium organyles after alcoholysis in order to stabilize the precursors with regard to $H_2O$ and $O_2$. The stabilized sol obtained after the union with the lead component is afterwards solidified by removing the volatile components so it can be used after renewed fusing for fibers, coatings or shaped bodies.

Basically, the structuring of PZT layers can be carried out either combined with layer-forming or after it. Examples for direct structuring are the printing of a PZT precursor sol with thermal ink jet printing (S. Bathurst et al., IEEE/MEMS (Tucson) (2008), 391-394; the sol used was obtained by diluting a commercial sol containing 2-methoxyethanol with isopropyl alcohol and 2-ethyl hexanoic acid) or by nanoimprint lithography (D. Hesse et al., Nanoimprint-Lithographie für oxidische Funktionsmaterialien, Abschlussbericht zum BMBF-Vorhaben 13N7986 [Nanoimprint Lithography for Oxidic Functional Materials, Final Report for BMBF Project 13N7986]). For the latter, the authors researched two different types of chemical solvent extraction, namely organometallic deposition (MOD) using commercially available organometallic precursors such as titanium isopropoxide or zirconium-n-propoxide, and water-repelling solvents, as well as the sol-gel process (superior to the first type of deposition), in which starting with flowable and also commercially available sols, a relatively highly viscous gel was used via hydrolysis with moisture for the precursor layer to be imprinted. Options for subsequent structuring are dry etching processes such as RIE (reactive ion etching), in which the PZT layer is removed by the selective bombarding with charged, plasma-generated gases. In addition, PZT layers can be structured with electron- and ion beam-assisted methods, such as direct electron beam writing and focused ion beam etching. According to DE 38 35 794 A1, structured PZT layers can also be obtained by selectively removing the applied PZT thin layer by means of (ablative) laser light.

Moreover, structured PZT layers are manufactured applying the lift-off method (see H.-J. Zhao et al., Fabrication of High Quality PZT Thick Film Using Lift-Off Technique, Nanotech. (2003), 1. ISBN 0-9728422-0-9). In it, a photoresist layer capable of being structured is initially applied on the substrate and then, after PZT coating, removed together with the PZT material that was applied directly on the photoresist. This process has the disadvantage that many reaction steps are necessary: First of all, a photoresist layer must be applied and structured; the unexposed remainder of the photoresist layer must be removed, the PZT sol must be applied, dried and pre-sintered, the photoresist layer and the PZT lying above it must, in turn, be removed, and finally the remaining structured PZT layer must be sintered.

T. Watanabe et al. describe a thermally controlled structuring method for making structured BTO layers in Thin Solid Films (2006), 515, 2692-2699. They focused a laser beam on an aqueous $Ba^{2+}$ solution that was on a titanium metal solution and induced a direct crystallization of the BTO with it. This structuring is not based on a photoreaction; rather, the localized temperature increase and the generation of extreme conditions result in a hydrothermal reaction, recognizable among other things by the widening of the structured areas compared with the lateral extension of the laser beam. An additional disadvantage of this method is the obligatory restriction on titanium metal as substrate because it makes up the sole titanium source.

N. Tohge et al. in J. Mater. Sci.—Mater. Electron. (1999) 10, 273-277, among others, have described a direct photochemical structuring of photosensitive PZT gels. The authors stabilized the hydrolysis-sensitive PZT precursors with β-diketones and obtained chelate complexes with an absorption band for the π-π*transition in the UV range (at about 360 nm for chelates with benzoylacetone). These chelate complexes were split when exposed with the corresponding wavelengths and this led to a changed solubility of the irradiated precursor ranges in acidic and alcoholic media. This, in turn, was exploited for selectively dissolving out the non-irradiated areas from the layers. To achieve this, aqueous methanolic solvents were used on the one hand, and nitric acid solvents on the other hand. According to the authors, structures down to a range of approx. 5 μm could be displayed. This structuring method is likewise suitable for other oxidic materials such as ZrO and strontium-endowed BTO, among others (K. Shinmou et al., Jpn. J. Appl. Phys. (1994), 33, L1181-L1184; Z. Weihua et al., Chinese Journal of Semiconductors (2006) 27, 1590-1594). However, the destruction of the complexes through irradiation has the effect of creating by-products in the irradiated area and this is disadvantageous. In addition, the destruction of ligands in close proximity to the metal cations that bind them causes the arrangement of the individual components with regard to one another, previously stabilized by the gel, to destabilize and with it their homogenous distribution essential for subsequent crystal formation. Furthermore, the underlying chemical mechanisms of this process involved in the solubility change are unknown and therefore standardization is difficult.

Most of the processes described above also have the disadvantage that the PZT materials used for applying the coatings are unstable in the long term and the individual components are subject to the risk of separation. This risk is eliminated only when the materials to be applied are in the form of a sol, in which the individual metal ions statistically distributed at the molecular level are already pre-fixed or when the location of the components of this sol is not fundamentally disturbed during structuring.

Needless to say, the disadvantages and problems described above concerning the manufacturing of structured piezoelectric layers through precursor layers that can be structured are not limited to the specific materials mentioned, but also occur during the actual or possible manufacturing of other oxidic layers produced via complexed/complexable precursors.

Although the ultrasound arrays mentioned in the beginning often consist of "one-dimensional" (i.e. thin, banded layers) or "two-dimensional" structures (namely thin, rectangular "fields"), the extension of the latter is frequently termed 2,5-D. They can be made of a composite that contains one (active) piezoelectric phase and an (inactive) polymer phase. Recently, however, ultrasound arrays are being manufactured in form of so-called 1-3 composites. In this process, the three-dimensionally structured piezoelectrically active material is available in form of rods, columns or fibers. According to the so-called "pick-and-place" method, they are manufactured by positioning individually previously manufactured rods or fibers in the polymer, e.g. in a woven glass fabric (see V. F. Janas and Ahmad Safari, "Overview of Fine-Scale Piezoelectric Ceramic/Polymer Composite Processing", J. Am. Ceram. Soc. 78(11), S. 2945-2955 (1995)). This method is very time consuming, however, because every rod must be individually positioned. An alternative method used nowadays is to manufacture 1-3 composites employing the so-called "dice-and-place" method, in which grids are cut into the piezoelectric ceramic with a diamond saw to carve our square columns. When doing so, a layer must remain on the lower end of the disk for maintaining the stability of the structure. To reduce electrical interference among the individual columns, the interstitial spaces are filled with a polymer (most of the time an epoxy resin) and the stabilizing ceramic layer is cut off after hardening. Such piezoelectric ultrasound transducers are the most promising ones for medical technology components. Their disadvantages lie in the downward limitation of the dimensions and therefore in the disintegration of especially fine structures by the saw and sawing time. In addition, a saw can only cut symmetrical patterns. A variation of this method is interdigital pair bonding, described by Ruibin Liu et al. (IEEE Transactions on Ultrasonics, Ferroelectrics and Frequency Control 48(1), 299-306 (2001)). In this way, minimal 4 μm separations can be achieved. The columns were 44 μm high and 36 μm wide.

Janas and Safari (loc. cit.) also describe methods for manufacturing real 3-3 composites: This is achieved, on the one hand, by coating an organic foam with a PZT slip: After burning out the organic material, a three-dimensional PZT skeleton is left, which is then filled with a polymer (reticulation). On the other hand, PZT fibers or organic fibers loaded with PZT can be woven and then still calcinated if need be. Both processes are naturally unsuitable for the manufacturing of exactly pre-defined structures.

Real 3D structures cannot be manufactured with the process described above by Tohge et al. either. Although it would be possible to separate the bodies extracted through irradiation from non-irradiated material owing to solubility differences, they are made up of decomposed complexes and are therefore not internally stable in the long term. A discrete, three-dimensional, non-supported body or one supported only by a substrate needs this stability.

BRIEF SUMMARY OF THE INVENTION

The inventive task is therefore the provision of structured bodies and layers, among them especially thin layers, from which through sintering—and, if applicable, polarization or other physical steps—oxidic functional layers or bodies can be made from PZT (lead zirconate titanate) or BTO (barium titanate), for example. To do this, the invention provides a manufacturing process and a process based on the previous one for producing functional, oxidic bodies and layers. These processes should allow the manufacturing of layers on any surfaces—even rough ones—and the manufacturing of shaped bodies of freely selectable geometry.

DETAILED DESCRIPTION OF THE INVENTION

Figure 1:
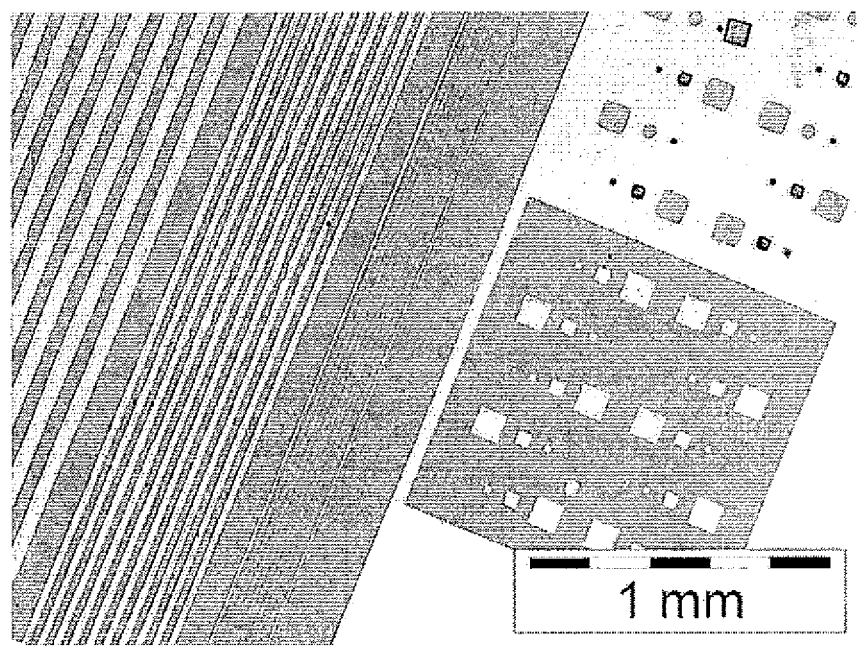
FIG. 1 shows the photo (taken with the light microscope) of PZT sols prepared with UV lithography (exposure, development).
Figure 2:
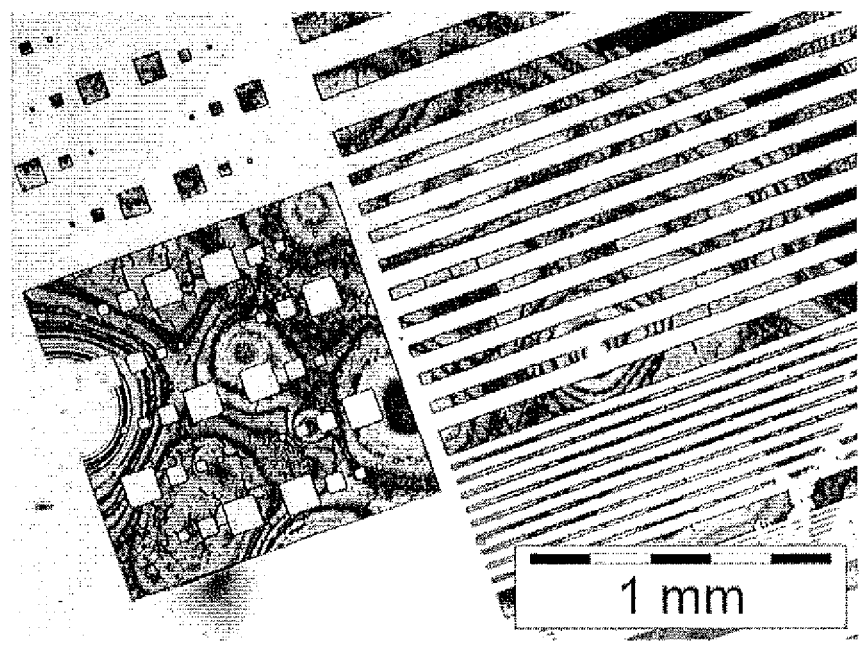
FIG. 2 is a photo (taken with the scanning electron microscope) of PZT sols prepared with two-photon polymerization that were subject to a subsequent development step.
Figure 3:
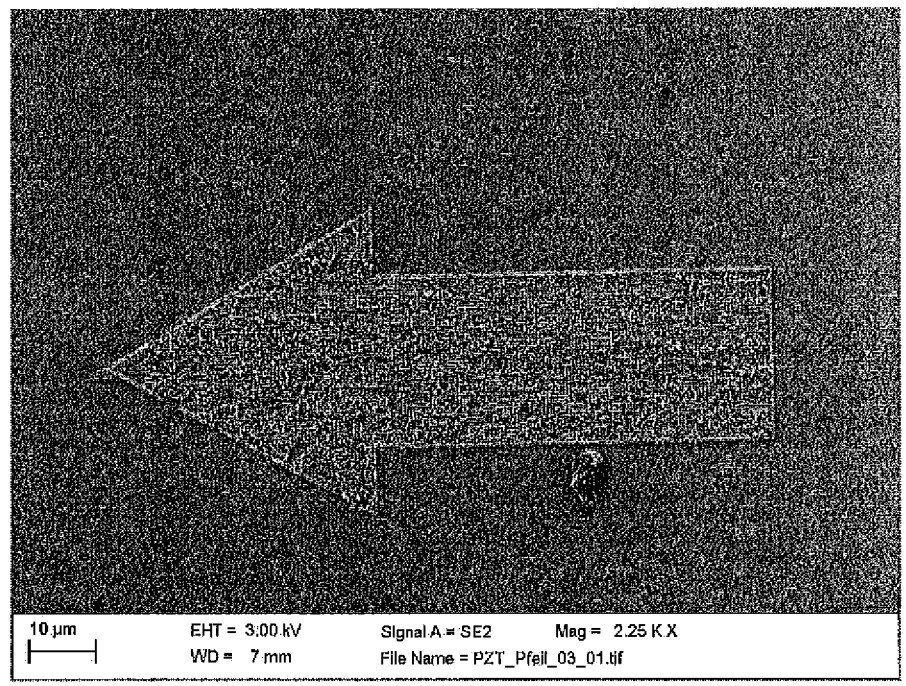

The invention describes the manufacturing and structuring polymerization of bodies and layers from a liquid, stabilized precursor material (a "sol") that contains one or several organo (transitional) metallic compounds made functional by photochemically active groups. By exposing these bodies or layers (or partial areas there from) with actinic radiation having the right wavelengths, the photochemically active groups are incorporated through addition polymerization into an organic network without creating by-products. Non-polymerized material can later be washed out; the bodies or layers can finally be converted to the corresponding structured oxide materials through sintering. The metals in the compounds of the precursor material have been selected so that a generally poly- or nano-crystalline oxide is formed during sintering, capable of having the desired function either as such or after suitable physical activation.

The oxides suitable for this invention are all those that are stable in the air either as such or as mixed oxides and whose cations can be complexed free of halides in solution with suitable, oxygen-rich anions/ligands (especially alkoxide ions, carboxylate ions) or form organometallic compounds with them such as magnesium, strontium and barium, in particular, from the second main group, aluminum, gallium and indium from the third main group, silicon, tin and lead from the fourth main group and the transition metals and among them, in turn, especially those of the second, third, fourth and fifth subgroup. Especially preferred are aluminum oxide, zirconium dioxide and the oxides of titanium, zirconium, lead, barium and strontium in a combination that shows piezo-electric behavior. The invention, however, is not limited to this, but also allows, for example, the manufacturing of bodies and layers from PMN (lead magnesium niobate) or mullite. Silicon oxides are less favorable, at least as unmixed oxides.

According to the invention, functionalized organo (transition) metallic compounds are made from or with these cations with photochemically active groups. These compounds contain complexable ligands/anions with at least one photochemically polymerizable group and at least one group allowing the stable formation of a complex. The latter can be an alkoxide group but carboxylate groups are preferred. If need be, the anions can be multidentate (chelate-forming) and also contain oxo- or keto-groups, for example. They can additionally, if applicable, have more than one photochemically polymerizable group.

According to this invention, a "photochemically polymerizable group" is one with one or several reactive C=C double bonds or rings that under the effect of actinic radiation are converted to propagating carbon chains. This reaction receives the name of "addition polymerization or" "chain growth polymerization". In it, no eliminations of molecular components, migrations or rearrangements take place. It is especially preferable if a radically polymerizable group is involved. This group's reactive double bond(s) can be chosen arbitrarily, for example a vinyl group or a component of an allyl or styryl group. It is preferable for it/them to be part of a double bond accessible to a Michael addition, to therefore contain an activated methylene group owing to the proximity to a carbonyl group. Among them, in turn, acrylate and methacrylate groups are especially preferred. Examples of reactive rings are epoxide or norbornene rings. Owing to the large number of possible polymerizable groups, the precursors of the invention can be photochemically structured along a wide wavelength range (from the Angstrom to the μm range). This invention does not deal with the manufacturing of structured layers and especially of structured shaped bodies from metallic compounds that contain exclusively Si as a metal.

The group that facilitates a stable complex formation can be selected from groups that are complexed in anionic form at the corresponding metal atom, i.e. especially under oxo- and carboxy groups, or that form a strong bond to the respective cations through the chelate effect. This/These group(s) must not necessarily bind ionically to the metal atom; they can also have atoms or residues with free electron pairs that bind in a multidentate way through this free electron pair, as is the case of diketones with keto groups in 1,3 position, for example. In addition to such group, the complex-forming molecule can contain one or several additional groups that make the formation of a chelate possible in the first place or one with more than two teeth. It is preferable for the group that facilitates the stable complex formation to bind the metal atom through oxygen atoms.

Two very simple molecules that have both a double bond and also facilitate the formation of a stable complex (and for this reason are very suitable for the invention) are acrylic acid and methacrylic acid. The latter is especially preferred. Other options for suitable complexing compounds are acrylic acid esters or methacrylic acid esters or—amides with a free carboxylic acid residue in the alcohol or amine part of the molecule, carboxylic acids substituted with an allyl group or 1,3 diketones. Two examples are 3-allyl acetyl-acetone and 4-(methacryloylamino) benzoic acid.

The sol needed for the invention is made by providing the metal(s) needed for the pure oxide or mixed oxide to be manufactured in form of a soluble, frequently commercially available starting material in a suitable solvent and allowed to react with the complexing compound accessible to polymerization. Needless to say, the prerequisite for this is for the complexing compound to be capable of displacing the ligands of the starting material. The expert knows the binding strengths of the respective compounds and cations, so that it is not necessary to provide more details about this. For this reason, only an example should be mentioned, namely that it is possible to advantageously use alkoxides as starting materials most of the time (except for the lead compounds that are usually dissolved in their acetate form). When the complexing compound has an advantage when competing with the ligands of the starting material owing to factors such as chelate formation or thermodynamic facilitation, the exchange can take place without additional supporting measures; otherwise, the equilibrium must be shifted in another way if need be—for example by using a large excess of the complexing compound and/or removing the ligand of the starting material through distillation or precipitation or in another way.

The manufacturing of the sols according to the invention can, in principle, be done analogously to the manufacturing of sols with a similar composition, in which the complexing ligands have no polymerizable C=C double bond. In this regard, reference can be made to DE 196 22 500 A1, DE 196 51 757 A1, DE 196 35 722 A1, DE 199 21 261 A1, DE 10 2004 02 626 A1 or DE 199 43 789 A1, where the manufacturing of sols for PZT, aluminum oxide, PMN, mullite, aluminum oxide, aluminum-silicon mixed oxide or zirconium oxide is described.

The (if need be, commercial) starting material, most of the time an alcohol (with the exception of lead, which is used in its acylate form), is added to a suitable solvent, generally an alcohol and often the same one that acts as ligand. If several alkoxides are used as starting materials, they can be added together. In an initial step, their ligands can be exchanged for other, better complexing ligands, for example for chelating alkoxides. In this respect, reference is made to the concept of DE 43 32 831 C1. If apart from metallic compounds used as alkoxides, others with another form are needed, they are preferably also added later, either as organic compounds (e.g. lead acetate) or as hydroxide/soluble oxide (e.g. barium hydroxide). Simultaneously or subsequently, the complexing organic compound is added in a way that, on the one hand, facilitates a stable complex formation of this compound with the available cations and when doing so displaces at least one part of the ligands of the metallic compounds and, on the other hand, is accessible to a photochemical (addition) polymerization. Naturally, this complexing compound can also be a mixture of two or more different compounds having the properties already mentioned.

The exchange, removal or addition of solvents allows the expert to bring the precursor material obtained (and, if applicable stabilized) in this way to the appropriate viscosity using methods known to him. The material now contains one or several complexed organo (transition) metallic compound(s) with at least partially photochemically polymerizable, organic complex ligands. In addition, the metal cations and—generally—metal-oxygen-metal bonds are linked together through van der Waals bonds to the extent that the precursor material is present in the solvent as a stable sol. The metal-oxygen-metal bonds are mostly the result of a hydrolytic condensation that already occurred in part and can be initiated, for example, by introduced water (e.g. using a starting material containing water from crystallization such as lead acetate) or humidity, but can also be otherwise selectively initiated as appropriate.

Layers produced from these liquid precursors can be structured directly and through various processes. These are, for example, UV lithography, direct laser writing with cw or ultra-short pulse lasers (multi-photon absorption technology), screen printing, ink jet printing or synchrotron radiation. When they are irradiated, a further cross-linking takes place via the organically polymerizable groups. To increase cross-linking, it is possible to mix the functionalized metallic compounds with the purely organic monomers, polymerizable through addition polymerization. These carry preferably two, frequently even more polymerizable groups. It is likewise preferable for these groups to be the same or similar ones that carry the complex ligands. Examples are trimethylol propane triacrylate, glycerin diacrylate or di(meth) acrylate, derived from bisphenol A or pentaerythrite.

UV lithography and multi-photon absorption are the preferred structuring methods for this invention.

Compared to UV lithography, multi-photon absorption has the advantage that layers with the 2,5-D structure mentioned above and also flat, layered, three-dimensional structures and even freely designed structured can be obtained with it in the $3^{rd}$ dimension. Thus, ultrasound arrays shaped like the 1-3 composite mentioned above can be formed with this method. In doing so, the three-dimensional piezoelectrically active material can be manufactured directly in the required columnar structure, thus saving working steps, material and energy. Furthermore, the column arrangements can be freely chosen, whereas a saw can only cut symmetric patterns. This allows one more adaptation of the ultrasound array to the finished structural part.

Moreover, the 3D structuring accomplished through multi-photon polymerization represents a simplified option to generate cross-linked structures or others that can be afterwards converted to oxides and used in the manner explained above.

The invention will now be explained in more detail by means of the PZT and BTO embodiments without limiting itself to them—because it is basically appropriate for the manufacturing of thin, but also thicker, structured oxide layers and oxidic bodies, and especially for such oxide bodies and layers that should fulfill specific, technically relevant functions (for example, that should be piezoelectric). According to that, it is naturally possible to convert not just the metallic alkoxides and acylates or hydroxides mentioned below but others too, via the sol-gel process in a ligand exchange reaction with polymerizable ligands, which form more stable complexes than the corresponding metallic alkoxides (or otherwise generate the complexes with polymerizable ligands by shifting the reaction's equilibrium, as mentioned above) to functionalize and thus obtain a sol that can be directly structured and can be converted, if need be, into a piezo-electric phase or one active in another way in a sintering or other process according to the structuring step.

Titanium and, if need be, zirconium compounds that can at least be exchanged for polymerizable ligands are used for producing the sol. The alkoxides are especially suitable for this.

In a preferred embodiment of the invention, it is possible to do without an alkoholysis when starting the synthesis of the sol, namely when Ti and Zr alkoxides or the like are used already at the start and no longer have to be exchanged for a more suitable complex ligand. In this respect, it is especially preferable to use the isopropylates of both metals. The Ti and Zr alkoxides or other complex compounds thereupon undergo conversion with the complex ligand(s) according to the invention. In principle, all organic compounds that have the required properties described above can be employed for this. Apart from the existence of at least one double bond, an acidic function is favorable because it is quite good for displacing the alkoxides from the complexes. Even the chelating effect can be used for this task. Especially suitable are compounds that contain acrylate and/or methacrylate groups because they combine the two functions in them and allow themselves to be polymerized with high reactive speed—especially after adding a photoinitiator.

To improve the layer formation properties, a diol, especially 1,3-propanediol can be used as solvent or added for supplementation, as known from S. Merklein (dissertation ISC/University of Würzburg 1994).

Alternatively, simultaneously, before or afterwards, the metallic compound converted with the ligand according to the invention can be added to the other metallic compound(s) if such is/are provided, e.g. with a lead compound such as lead acetate or with barium hydroxide. Afterwards, the sol can be carefully evaporated to small bulk (preferably under normal pressure at increased temperatures). In the process, the volatile components (especially the alcohol of the used transition metal alkoxide and, if applicable, excessive acrylic acid or the like and other components such as acetic acid if lead acetate was used for the lead component) are removed, while the diol—owing to its chelate-forming properties—remains as ligand in the metallic compound as long as the evaporation to a small bulk is carried out at a temperature below its boiling point (213° C. for propanediol). By using the diol, the sol remains liquid-viscous, so that it does not have to be melted before the application, as described for example in DE 43 32 831 C1 for the PZT sol evaporated to small bulk. The viscosity can be adjusted by the quantity of used diol; for this reason, the sol can be used as precursor material without any additional steps after the volatile components have been removed. If no diol is added, it may be necessary to dilute the highly viscous sol produced with a suitable solvent before the application.

After the sol has been prepared, it can be stored for a long time in closed containers, even without protective gas. As soon as it should be used for the invention, it is applied on a substrate by means of a usual method like spin or dip coating. In this way, layers with a thickness of up to approx. 35 µm, preferably of up to approx. 25 µm, and very preferably within the range of 1 to 5 µm (e.g. in the range of about 2 µm), but also above it can be prepared from the corresponding precursor material, e.g. PZT or BTO sols, which can be directly structured all the way to 3D with light. Photochemical cross-linking reactions for small wavelengths (in the Angstrom range) are initiated, preferably without photoinitiator. The structuring can take place with the help of one- and multi-photon processes (for example, UV lithography, multi-photon absorption with ultra short pulse lasers), in which case organic polymerization reactions occur in the exposed areas, whereas the sol remains in the organically non-cross-linked state in the non-exposed areas.

With the photosentitive sols produced in the invention, especially lead zirconium titanium oxide sols and barium titanate sols, structured thin layers can also be obtained using direct structuring processes such as lithography (without employing additional lift-off processes) or laser direct writing with continuous wave (cw) or ultra short pulse lasers, however. Even structured thick layers are possible. Since there is no generally binding definition for "thick" and "thin layers", the following classification will be used: A thickness of an atomic spacing of up to 1-10 nm is considered the "thinnest layer", the range from 10 nm to 5 µm is considered a thin layer and layers having a thickness of more than 5 µm are considered thick layers. A polymerization and structuring by means of multi-photon absorption technology makes it possible to generate—apart from the free choice of substrate with little use of material through location-specific solidification from a bath fluid in a receptacle—any kind of shapes and therefore also freely designed 3D shaped bodies, which can additionally be given an individual surface structuring. Such structuring has already been shown for other inorganic-organic hybrid materials (see, for example, R. Houbertz, J. Schulz, J. Serbin, B. N. Chichkov, "Schnelle Herstellung photonischer Kristalle" [Fast Production of Photonic Crystals], Phys. unserer Zeit, 36 (2005), 278-285). With the photosensitive sols of this invention, flat or three-dimensional structural sizes can be obtained in this way that can reach sizes from about 100 nm to the far µm range, even all the way to the mm or cm range. The usable wavelengths extend from the Angstrom to the µm range.

After photochemical structuring, the layers or bodies are rinsed with an organic solvent in which the complexed precursor materials are soluble, for example with alcohols/diols as they were used for preparing the sols used according to the invention. After a drying that generally lasts one or several hours (even longer if necessary) and can take place under temperatures from room temperature to over 100° C., the structured layers obtained in this way can be sintered employing suitable, known methods under the temperatures favorable for the respective oxides or the formation of their specific morphology, for example at up to 600° C. for PZT and BTO. Owing to the sintering conditions, the piezoelectric properties of the PZT and BTO layers are controlled and this ensures the variability of the piezoelectric coefficients such as $d_{31}$ and $d_{33}$.

The piezo layers and bodies obtained with this invention can be used, for example, in micro-electromechanical systems (MEMS), micro-optical electromechanical systems (MOEMS), ultrasound transducers or in sensors and actuators. One example would be actuating coatings of Petri dishes for cell cultures, for example. These coatings can serve for direct ultrasound coupling in or to cells.

Ferroelectric or piezoelectric layers can also be used in form of dielectric layers or structures, for example for "field modulation" (the variation of the electrical field distribution on chips, circuit boards, in modules or systems) or with regard to their electrical properties (by varying electrical resistance or conductivity) and hence, with regard to their thermal conductivity, in controllable barrier layers and in field effect transistors, for example.

The invention will now be explained in more detail with the help of the examples given below.

EXAMPLES

Example 1 Preparation of a PZT Sol with Methyl Acrylic Acid as Polymerizable Ligand and Preparation of a Structured Layer from it 6.68 g (23.5 mmol, 6.47 mL) of titanium(IV)-n-propylate and 14.4 g (26.5 mmol, 11.9 mL) of zirconium(IV)-n-propylate (70% by weight in n-propanol) were added to a 50 mL round-bottomed flask. While stirring, 7.75 g (90 mmol, 7.65 ml) of methyl acrylic acid were slowly added dropwise to this mixture, which slightly heated up in the process. After it cooled down to room temperature, about 14.5 mL of 1,3-propanediol were quickly added dropwise and stirred again. To this Ti/Zr mixture, 16.3 g (50 mmol) of lead(II) acetate-trihydrate were added and the mixture heated up to 80° C. to dissolve the lead component in the mixture. Afterwards, n-propanol was removed like all other volatile components under normal pressure at an oil bath temperature of 130° C. A pale yellow, slightly viscous sol was obtained. Yield: 43.4 g 0.21 g (66.4 mmol, 1% by weight) of Lucirin TPO-L was added to 21.0 g of the PZT sol obtained in this way and stirred overnight. Afterwards, the mixture was left standing for three days to allow any bubbles produced by the reactive mixture to escape. The sol was spinned down with spin coating at 7500 rpm for 90 s on the substrate. The mixture obtained was then photochemically structured with a mask aligner (365 nm±Δλ) for 60 s. Afterwards, the structures were developed with an organic solvent mixture that rinsed off the unexposed areas.

The sintering of the layers took place starting at room temperature and ending at 600 or 700° C., after they had been previously dried for 15 h at 110° C.

Example 2 Preparation of the Mixture from PZT Sol with Methyl Acrylic Acid as Polymerizable Ligand and Trimethylolpropane Triacrylate (TMPTA) as Polymerizable Monomer and Production of a Structured Layer from The PZT sol was prepared similarly to Example 1. Afterwards, 0.22 g (0.7 mmol) of TMPTA were added to 1.0 g of the PZT sol (approx. 1.2 mmol Ti+Zr) and stirred overnight. The proportion corresponds to approx. 0.6 mol of TMPTA for every mol of zirconium and titanium complexes. Afterwards, 0.05 g (0.15 mmol, about 4% by weight) of Lucirin TPO-L was added to the PZT sol/monomer mixture, which was stirred overnight and then left standing for three days.

The mixture of PZT sol, monomer and photoinitiator obtained in this way was spinned down on the substrate using spin coating at 7500 rpm for 90 s and then photochemically structured with a mask aligner (365 nm±Δλ) for 60 s. Afterwards, the structures were developed with an organic solvent mixture that rinsed off the unexposed areas.

After drying at 110° C. for 15 h, the layers were sintered starting at room temperature all the way to 600° C.

Example 3 Preparation of a BTO Sol with Methyl Acrylic Acid as Polymerizable Ligand and Preparation of a Structured Layer from it 7.59 g (44.1 mmol) of barium hydroxide monohydrate were added to a 50 mL round-bottomed flask and dissolved in 34.4 g (573 mmol, 32.8 ml) of glacial acetic acid. 15.0 g (44.1 mmol, 15.0 mL) of titanium(IV)-n-butylate were added to another 50 mL round-bottomed flask and 7.59 g (88.2 mmol, 7.50 mL) of methyl acrylic acid slowly added dropwise while stirring. The mixture heated up in the process. After cooling down to room temperature, the Ti methyl acrylic acid solution was added to the Ba solution and stirred at room temperature for about 30 min. Afterwards, the volatile components were vacuum distilled at an oil bath temperature of 40° C. to obtain a yellow, viscous sol. Yield: 33.0 g 0.21 g (66.4 mmol, 1% by weight) of Lucirin TPO-L was added to 21.0 g of the PZT sol obtained in this way and stirred overnight. Afterwards, the mixture was left standing for three days to allow any bubbles produced by the reactive mixture to escape. The sol was spinned down with spin coating at 7500 rpm for 30 s on the substrate. The mixture obtained was then photochemically structured with a mask aligner (365 nm±Δλ) for 60 s.

The layers were sintered staring at room temperature all the way to 700° C. (hold-up time: 1 h), after they had been previously dried for 15 h at 110° C.

Example 4 Preparation of a PZT Sol with Methyl Acrylic Acid as Polymerizable Ligand and Acetic Acid as Additional, Non-En Polymerizable Ligand and Production of a Structured Layer from it 2.67 g (7.83 mmol, 2.37 mL) of titanium(IV)-n-butylate and 4.24 g (8.83 mmol) of zirconium(IV)-n-butylate (80% by weight in n-butanol) were added to a 50 mL round-bottomed flask. While stirring, 2.58 g (30 mmol, 2.55 ml) of methyl acrylic acid were slowly added dropwise to this mixture, which slightly heated up in the process. After cooling down to room temperature, 4.75 ml of 1,3-propanediol were quickly added dropwise and stirred again. 6.95 g (18.3 mmol) of lead(II)acetate-trihydrate were added to the Ti/Zr mixture, which was heated to 80° C. to dissolve the lead component in the mixture. Afterwards, n-butanol was removed under reduced pressure (21-61 mbar) distillation at an oil bath temperature of 55-65° C. like all other volatile components. A pale yellow, slightly viscous sol was obtained. Yield: 14.29 g 0.636 g (0.606 ml, 10.6 mmol) of acetic acid was added to the sol and stirred. Afterwards, 3.72 g (4.59 mL) of n-butanol were added to the mixture for adjusting a solids concentration of 31%.

0.02 g (6.32 mmol, 2% by weight) of Lucirin TPO-L was added to the 4.98 g of the PZT sol obtained in this way and stirred overnight. The mixture was left standing for three days to allow any bubbles produced by the reactive mixture to escape and subsequently filtered to remove possible solid components. The sol was spinned down on the substrate with spin coating at 6000 rpm for 30 s. The mixture obtained was then photochemically structured with a mask aligner (365 nm±Δλ) for 60 s. Afterwards, the structures were developed with an organic solvent mixture that rinsed off the unexposed areas.

The layers were sintered starting at room temperature or at 500° C. all the way to 700° C. after having been previously dried for 1 h at 110° C. and pre-sintered at 360° C. for 10 min.

Example 5 Production of a Body with the Help of Two- or Multi-Photon Polymerization With a device based on the multi-photon polymerization principle known from the state of the art, it is possible to produce three-dimensional structures without additional working steps as etching, for example. To accomplish this, a focused ultra short pulse laser is employed for scanning the lines and layers of the material to be structured, thus generating a spatially defined polymerization by focusing the laser.

In this example, the material to be structured is the PZT sol from Example 4 to which the 1.5% by weight photostarter Lucirin TPO-L was added, but was not diluted with n-butanol to 31 percent by weight, however, but with 4.75 mL 1,3-propanediol and 3 mL propylene glycol monomethyl ether acetate down to 25 percent by weight. Afterwards, it was filled into a bath and irradiated with a focus of the device so that only the volume elements (Voxel) that were in the focus of the radiation were solidified, but not the material that the radiation passes through on its way to reach it. For layers and very small height-wise three-dimensional surfaces, the "bath" can already serve as a layer of the material between a substrate, e.g. an initial small glass sheet, and second small glass plate that can be separated, for example, from 0.2 to 3 mm from another one according to need. Larger structures are generated in a container for bathing materials. In this, the container bottom or a carrier found therein serves as substrate on which the first solidified volume elements adhere. For cuboid-shaped structures having a 10 μm edge length, a writing speed of 20 μm/s and exposure power of 6-15 mW is used in combination with a 100× immersion oil lens with a numerical aperture of 1.4. After the material is exposed, the non-polymerized—and therefore not solidified—PZT sol was removed in a development step similarly to Example 4 and finally rinsed with 4-methyl-2-pentanone.

The invention claimed is:

1. Process for manufacturing a structured shaped body or a structured layer made of a mixed oxide from a combination of barium and titanium and wherein the mixed oxide shows piezoelectric or magnetic behavior after appropriate activation, the process comprising the steps of:
    (a) dissolving at least one metal compound of at least one metal selected from barium and titanium in an organic solvent and/or exchanging a ligand of at least one metal compound of at least one metal selected from barium and titanium for a stabilizing ligand, thereby forming a solution,
    (b) adding to the solution a ligand with at least one photochemically polymerizable group and at least one group that allows a stable complex formation, and further adding purely organic monomers carrying more than two polymerizable groups that are polymerizable through addition polymerization, and optionally further adding a metal acylate or a metal hydroxide dissolved or in a solid form to the solution, to thereby form a product comprising a sol
    (c) applying the sol on a substrate whereby the sol is at least one of (i) applied in structured form or (ii) any unexposed areas of the sol are removed after polymerization and the shaped body or the structured layer remains,
    (d) exposing the sol anisotropically in such a way that a polymerization of the photochemically polymerizable groups takes place in the exposed areas to form the structured shaped body or structured layer, and
    (e) sintering of the shaped body or the layer until removal of organic components,
    characterized in that step (b) takes place either without additional supporting measures or that this step is carried out by implementing a measure through which a reaction equilibrium is shifted towards the product.

2. Process according to claim 1, wherein the shaped body or the layer obtained according to step (e) is polarized in such a way that a piezoelectric shaped body or a piezoelectric layer is formed.

3. Process according to claim 1, wherein the polymerization is an addition polymerization.

4. Process according to claim 1, wherein at least one metal compound is an alkoxide dissolved in an alcohol or two or more metal compounds are alkoxides dissolved in the same alcohol.

5. Process according to claim 1, wherein the anisotropic exposure takes place in a process selected from UV lithography, direct laser writing with cw or ultra short pulse lasers, or the anisotropic exposure is an exposure that is, or encompasses the aid of two- or multi-photon absorption.

6. Process according to claim 1, wherein the sol in step (c) is applied in structured form by means of screen printing or ink jet printing.

7. Process according to claim 1, wherein the group that can be photochemically polymerized is selected from acrylate and methacrylate and/or wherein the group that allows the stable complex formation to take place is selected from carboxylate groups and 1,3-diketones.

* * * * *